(12) United States Patent
Mabuchi

(10) Patent No.: US 8,704,276 B2
(45) Date of Patent: *Apr. 22, 2014

(54) SOLID-STATE IMAGING DEVICE, METHOD OF MANUFACTURING THE SAME, AND IMAGING APPARATUS

(71) Applicant: Sony Corporation, Tokyo (JP)

(72) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/907,111

(22) Filed: May 31, 2013

(65) Prior Publication Data

US 2013/0264619 A1  Oct. 10, 2013

Related U.S. Application Data

(60) Continuation of application No. 12/656,695, filed on Feb. 12, 2010, now Pat. No. 8,541,255, which is a division of application No. 12/149,049, filed on Apr. 25, 2008, now Pat. No. 7,842,987.

(30) Foreign Application Priority Data

May 29, 2007 (JP) ................................ 2007-142452

(51) Int. Cl.
 *H01L 31/113* (2006.01)
(52) U.S. Cl.
 USPC ...................... 257/222; 257/225; 257/E27.13
(58) Field of Classification Search
 USPC ................................................ 257/222, 225
 See application file for complete search history.

(56) References Cited

U.S. PATENT DOCUMENTS

| 4,791,469 A | 12/1988 | Ohmi et al. |
| 7,151,287 B1 | 12/2006 | Scheffer et al. |
| 7,453,110 B2 | 11/2008 | Hwang |
| 7,492,014 B2 | 2/2009 | Pidin |
| 2003/0193586 A1 | 10/2003 | Hayakawa |

(Continued)

FOREIGN PATENT DOCUMENTS

JP  5-36963  2/1993

(Continued)

OTHER PUBLICATIONS

Japanese Office Action issued Aug. 21, 2012 for corresponding Japanese Application No. 2007-142452.
S. Motamarri, Metal Gates for Future CMOS IC's, Jun. 14, 2004.

*Primary Examiner* — Julio J Maldonado
*Assistant Examiner* — Mohammad Choudhry
(74) *Attorney, Agent, or Firm* — Rader, Fishman & Grauer PLLC

(57) ABSTRACT

A solid-state imaging device includes a semiconductor substrate; a first conductive region of the semiconductor substrate; a first conductive region on an upper surface side of the first conductive region of the semiconductor substrate; a second conductive region below the first conductive region on the upper surface side of the first conductive region of the semiconductor substrate. The solid-state imaging device further includes a photoelectric conversion region including the first conductive region located on the upper surface side of the first conductive region of the semiconductor substrate and the second conductive region and a transfer transistor transferring charges accumulated in the photoelectric conversion region to a readout region; and a pixel including the photoelectric conversion region and the transfer transistor. The first conductive region, which is included in the photoelectric conversion region, extends to the lower side of a sidewall of a gate electrode of the transfer transistor.

10 Claims, 7 Drawing Sheets

(56) References Cited

U.S. PATENT DOCUMENTS

2004/0227164 A1  11/2004  Lee et al.
2005/0006676 A1   1/2005  Watanabe
2006/0181626 A1   8/2006  Lee

FOREIGN PATENT DOCUMENTS

| JP | 2003-282858 A | 10/2003 |
| JP | 2004-128296 A |  4/2004 |
| JP | 2004-214665 A |  7/2004 |
| JP | 2006-049921   |  2/2006 |
| JP | 2006-066481 A |  3/2006 |

SOLID-STATE IMAGING DEVICE, METHOD OF MANUFACTURING THE SAME, AND IMAGING APPARATUS

CROSS REFERENCES TO RELATED APPLICATIONS

The present invention is a Continuation application of application Ser. No. 12/656,695, filed on Feb. 12, 2010, which is a Divisional application of application Ser. No. 12/149,049, filed on Apr. 25, 2008, now U.S. Pat. No. 7,842,987, issued on Nov. 30, 2010, and contains subject matter related to Japanese Patent Application JP 2007-142452 filed in the Japanese Patent Office on May 29, 2007, the entire contents of which being incorporated herein by reference.

BACKGROUND OF THE INVENTION

1. Field of the Invention

The present invention relates to a solid-state imaging device that converts a signal charge photoelectrically converted by a photoelectric conversion region into an electric signal and the resulting electric signal is then transferred by a transfer transistor, a method of manufacturing such an solid-state imaging device, and an imaging apparatus provided with the solid-state imaging device.

2. Description of the Related Art

FIG. 1 illustrates a schematic cross sectional diagram of a transfer transistor used in the solid-state imaging device according to the related art. As shown in FIG. 1, the transfer transistor includes a gate electrode 102 formed on a first conductive type, such as a p-type, semiconductor substrate 100 through an insulating film 101. In addition, a sidewall 103 is formed on the gate electrode 102.

In a photoelectric conversion region 108, for example, an n-type second conductor-type semiconductor region 104 is formed as a photodiode embedded in the semiconductor substrate 100. Furthermore, for example, a surface-shield region with a p-type first conductive-type semiconductor region 105 is formed on the second conductive-type semiconductor region 104. The first conductive-type semiconductor region 105 of the photoelectric conversion region 108 is provided for preventing the generation of dark current due to an influence of the interface of the semiconductor substrate 100. A second conductive-type semiconductor region 107 having an impurity concentration higher than that of a second conductive-type semiconductor region 104 is formed on the semiconductor substrate 100 in a readout region 109 to be used as a charge readout region. In addition, a second conductive-type semiconductor region 106 having an impurity concentration lower than that of the second conductive-type semiconductor region 104 is formed below the sidewall to obtain an LDD structure.

Such a transfer transistor accumulates photoelectrically converted electrons in the second conductive-type semiconductor region 104 of the photoelectric conversion region 108. When a high voltage is applied to the gate electrode 102, electrons accumulated in the second conductive-type semiconductor region 104 are transferred from the photoelectric conversion region 108 to the readout region 109.

In the transfer transistor constructed as described above, the photoelectrically converted charges are accumulated in a portion comparatively deep (i.e., a deep portion) in the second conductive-type semiconductor region 104 of the photoelectric conversion region 108. Therefore, a high voltage may need to be applied to the gate electrode 102 to complete the transfer of charges. However, it is difficult to provide the gate electrode with a high voltage when pixels are further miniaturized.

Furthermore, the first conductive-type semiconductor region 105 may become a barrier to the transfer of electrons from the photoelectric conversion region 108 to the readout region 109 in the transfer transistor constructed as described above. Thus, the first conductive-type semiconductor region 105 is not formed below the sidewall 103 except in the case of thermal diffusion in the manufacturing process. For this reason, the interface of the semiconductor substrate 100 exists in the second conductive-type semiconductor region 104 below the sidewall 103. Accordingly, dark current occurs in the second conductive-type semiconductor region 104 due to the interface of this semiconductor substrate 100, causing a defective pixel with a white spot. When the first conductive-type semiconductor region 105 is formed below the sidewall 103, it may be a transfer barrier and a still higher voltage may need to be applied to the gate electrode.

Japanese Unexamined Patent Application Publication No. 2006-49921 (JP 2006-49921 A), for example, has proposed a technology for reducing a transfer voltage in the configuration of the transfer transistor described above using an epitaxial growth method that forms a surface-shield region and an elevated source drain (ESD) region on a semiconductor substrate to reduce the transfer voltage.

SUMMARY OF THE INVENTION

However, in the configuration of the transfer transistor as described in JP 2006-49921 A, a p-type semiconductor region functioning as a surface-shield region is not formed on the interface of an n-type semiconductor region on the lower portion of the side wall of a gate electrode on the PD side. Therefore, it is difficult to prevent dark current from being generated from the interface of the n-type semiconductor region although a transfer voltage may be lowered, causing a defective pixel with a white spot or the like.

It is desirable to provide a solid-state imaging device which is capable of reducing a transfer voltage and preventing dark current generated from the interface of a semiconductor region. Further, it is desirable to provide a method of manufacturing such a solid-state imaging device and an imaging apparatus provided with the solid-state imaging device.

According to an embodiment of the present invention, there is provided a solid-state imaging device. The solid-state imaging device includes: a semiconductor substrate; a first conductive region of the semiconductor substrate; a first conductive region located on an upper surface side of the first conductive region of the semiconductor substrate; a second conductive region located below the first conductive region located on the upper surface side of the first conductive region of the semiconductor substrate. Further, the solid-state imaging device includes a photoelectric conversion region including the first conductive region located on the upper surface side of the first conductive region of the semiconductor substrate and the second conductive region. Furthermore, the solid-state imaging device includes a transfer transistor transferring charges accumulated in the photoelectric conversion region to a readout region. The first conductive region, which is included in the photoelectric conversion region, extends to the lower side of a sidewall of a gate electrode of the transfer transistor. A pixel including the photoelectric conversion region and the transfer transistor is provided in the solid-state imaging device.

According to another embodiment of the present invention, there is provided an imaging apparatus including a solid-state imaging device, an imaging optical unit, and a signal processing unit. The solid-state imaging device includes an imaging region with a pixel having a photoelectric conversion region, a transfer transistor, and a readout region on a semiconductor substrate. Further, the solid-state imaging device includes a first conductive region of the semiconductor substrate, a first conductive region located on an upper surface side of the first conductive region of the semiconductor substrate, a second conductive region located below the first conductive region located on the upper surface side of the first conductive region of the semiconductor substrate. The photoelectric conversion region includes the first conductive region located on the upper surface side of the first conductive region of the semiconductor substrate and the second conductive region. The transfer transistor transfers charges accumulated in the photoelectric conversion region to the readout region. The first conductive region, which is included in the photoelectric conversion region, extends to the lower side of a sidewall of a gate electrode of the transfer transistor. The imaging optical unit is provided for introducing light from an imaging subject into the solid-state imaging device. The signal processing unit is provided for processing signals of an image captured by the solid-state imaging device.

According to further embodiment of the present invention, there is provided a method of manufacturing a solid-state imaging device. The method includes the steps of: forming a gate electrode in a first conductive region of a semiconductor substrate on the semiconductor substrate through an insulating film, forming a second conductive region on the surface of the semiconductor substrate at an end of the gate electrode, forming a semiconductor layer on the second conductive region by selective epitaxial growth to form a first conductive region, and forming a sidewall of the gate electrode on the first conductive region formed by the selective epitaxial growth.

In the solid-state imaging device and the imaging apparatus according to the embodiments of the present invention, the first conductive region of the photoelectric conversion region is extended on the upper surface side of the semiconductor substrate to the lower portion of the sidewall of the gate electrode. Therefore, the whole surface of the photoelectric conversion region can be covered with the first conductive region, thereby preventing the generation of dark current due to the presence of the interface of the semiconductor substrate on the photoelectric conversion region.

In addition, the photoelectric conversion region is formed on the surface of the semiconductor substrate and the first conductive region is formed on the semiconductor substrate. With such a structure, the photoelectric conversion region in which charges are accumulated is formed in a shallow portion of the semiconductor substrate. Therefore, a voltage applied to the gate electrode when transferring the charges accumulated in the photoelectric conversion region to the readout region can be reduced.

In addition, according to the method of manufacturing a solid-state imaging device in accordance with an embodiment of the present invention, the first conductive region is formed on the semiconductor layer formed on the photoelectric conversion region by selective epitaxial growth. Thus, the generation of dark current due to the presence of the interface of the semiconductor substrate on the photoelectric conversion region can be prevented. In addition, the photoelectric conversion region is formed on the surface of the semiconductor substrate, so that charges accumulated by photoelectric conversion can be allowed to be accumulated near the surface of the semiconductor substrate. Thus, the transfer of charges to the readout region can be easily carried out.

According to the embodiments of the present invention, transfer voltage can be reduced and dark current generated from the interface of the semiconductor substrate can be suppressed.

DESCRIPTION OF THE PREFERRED EMBODIMENTS

Figure 1:
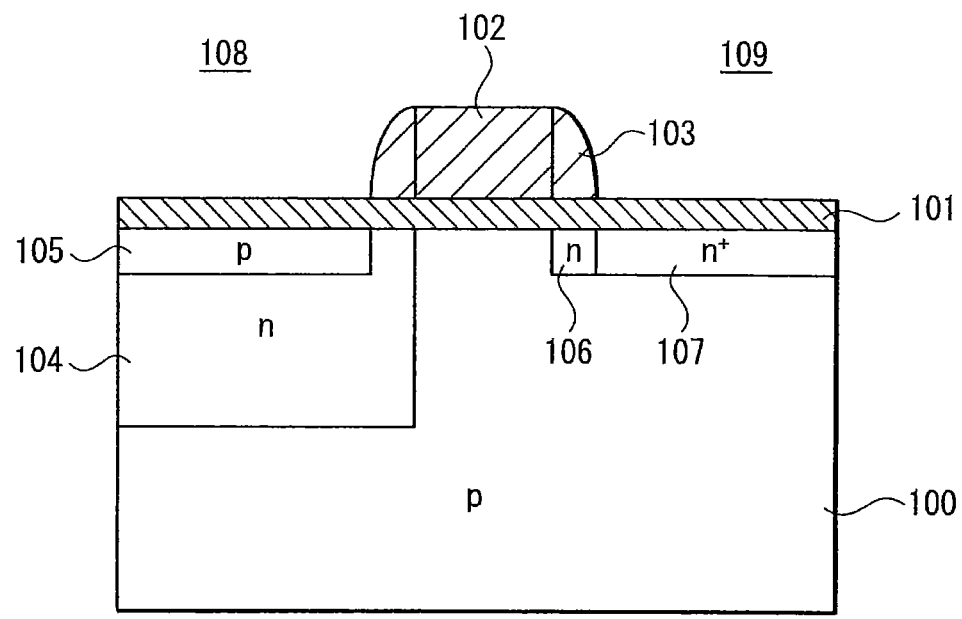
FIG. 1 is a schematic cross-sectional diagram illustrating a transfer transistor of a solid-state imaging device according to the related art.
Figure 2:
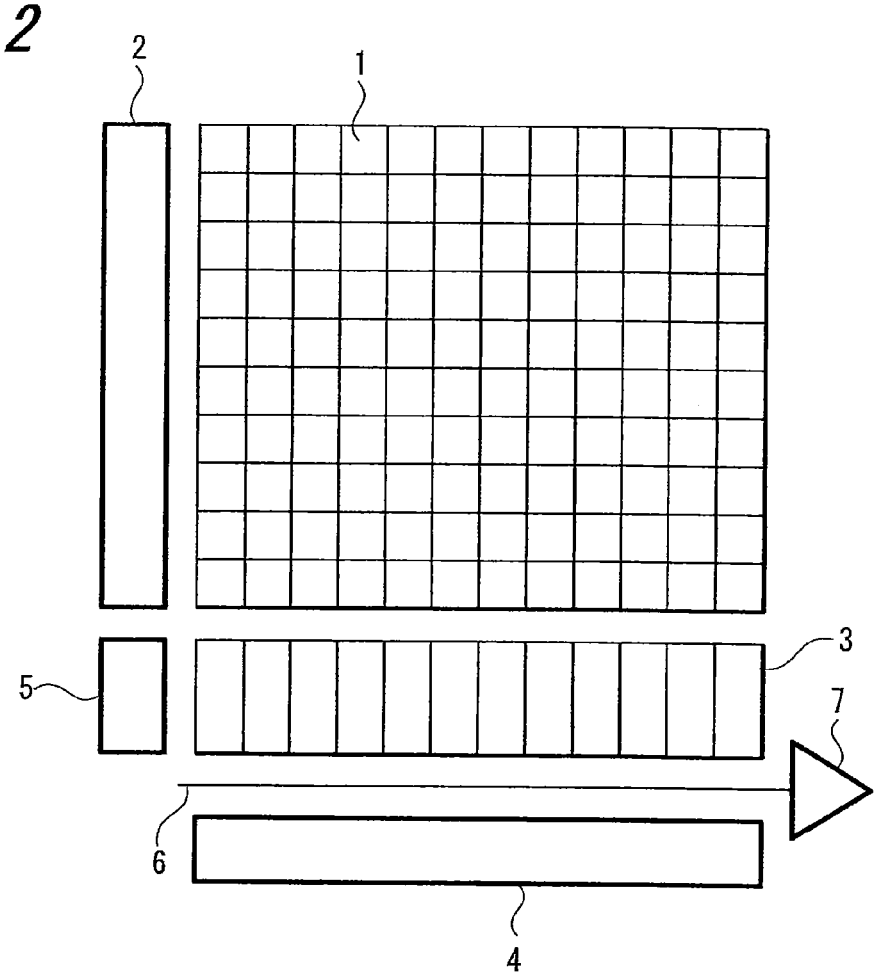
FIG. 2 is a schematic diagram illustrating a solid-state imaging device according to an embodiment of the present invention.

Embodiments of the present invention will be described with reference to the attached drawings. FIG. 2 is a schematic diagram illustrating a solid-state imaging device in accordance with an embodiment of the present invention. The solid-state imaging device illustrated in FIG. 2 includes a pixel unit 1, a vertical driving circuit 2, a column unit 3, a horizontal driving circuit 4, a control circuit 5, a horizontal bus 6, and an output circuit 7.

The pixel unit 1 includes a number of pixels arranged in matrix. In addition, the pixel unit 1 includes a pixel drive line arranged every pixel row and a vertical signal line arranged every pixel column. Pixels are driven by pixel drive lines extending in the row direction (not shown). In addition, pixel signals are analog signals and output to the respective vertical signal lines extending in the column direction (not shown).

The vertical driving circuit 2 selects a pixel drive line and then feeds a pulse for driving the pixel to the pixel drive line. Subsequently, each of the pixel drive lines is driven, so that pixels in the row can be driven at a time.

The control circuit 5 receives an input clock and data indicating an operation mode or the like and outputs the internal data of the solid-state imaging device and so on. In addition, the control circuit 5 supplies clocks and pulses for driving the vertical driving circuit 2, the horizontal driving circuit 4, the column unit 3, and the output circuit 7.

The column unit 3 includes column circuits arranged corresponding to the columns of pixels. The column unit 3 reads out pixel signals of the respective columns in the pixel unit 1 through the vertical signal lines of the pixel unit 1. Subsequently, the readout pixel signals are subjected to CDS (correlated double sampling: removing a fixed pattern noise), signal amplification processing, AD conversion processing, and so on.

The horizontal driving circuit 4 selects signals retained in the column unit 3 in order and then leads the signals to the horizontal bus 6. The output circuit 7 processes signals from the horizontal bus 6 and then outputs the processed signals. The output circuit 7 may, for example, carry out only buffering or carry out black-level adjacent, column-variation correction, various kinds of digital-signal processing, or the like.

Figure 3:
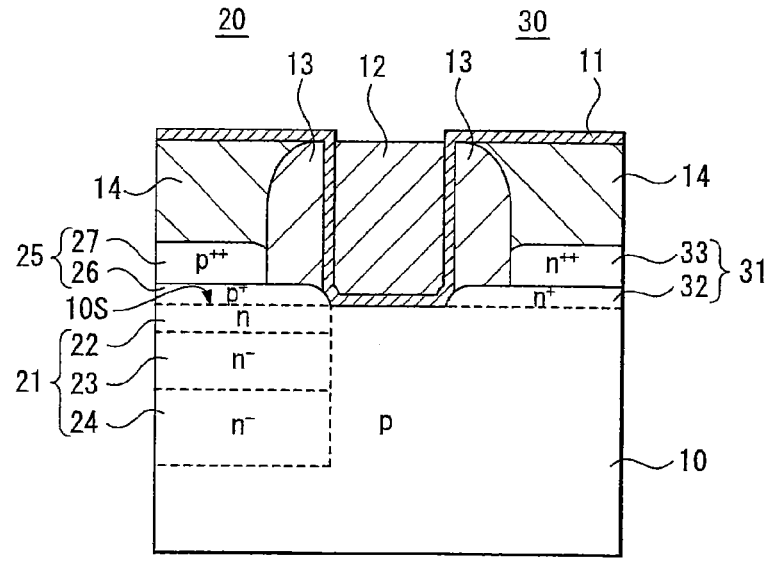
FIG. 3 is a cross sectional diagram illustrating main parts of the solid-state imaging device according to an embodiment of the present invention.

Next, FIG. 3 illustrates the cross sectional diagram of a transfer transistor formed in each pixel in the solid-state imaging device of the present embodiment illustrated in FIG. 2. As shown in FIG. 3, the description is carried out using, for example, one transfer transistor formed on a pixel region among pixel regions and their peripheral circuit regions formed on a solid-state imaging device in accordance with an embodiment of the present invention. In a sold-state imaging device, furthermore, two or more transistors may be formed on the pixel region and the peripheral circuit region thereof in addition to a transfer transistor. In other words, two or three or more transistors are formed if required.

As shown in FIG. 3, the transfer transistor has a gate electrode 12 formed on a first conductive type (e.g., p-type) semiconductor substrate 10 through an insulating film 11. A sidewall 13 made of silicon nitride or the like is formed on the side face of the gate electrode 12 through the insulating film 11. An insulating interlayer 14 is formed on the semiconductor substrate 10. If a first conductive-type semiconductor region is formed in a part of the semiconductor substrate 10, the transfer transistor and so on may be formed on the first conductive-type semiconductor region.

The gate electrode 12 can be formed by polysilicon or a metal gate made of an electric conductor. The electric conductor material that forms the metal gate may be Ni silicide, which is a compound made of nickel and silicon. In addition, as a full metal gate, a tantalum-based metal or a titanium-based metal can be used depending on the purpose of NMOS, PMOS, or the like.

A decrease in gate resistance can be attained by providing a metal gate electrode as the gate electrode 12. According to the related art, the connection with a gate electrode may require metal wiring provided to the upper layer of the transistor and a contact portion to the gate electrode formed from the metal wiring. In contrast, according to the embodiments of the present invention, the gate resistance is lowered, so that the gate electrode can be wired directly without forming the contact portion with the upper layer wiring. Furthermore, the upper layer wiring is eliminated to widen the interval between the metal wires of the respective pixels, so that the pixel aperture can be widened to increase the sensitivity of the pixel. In addition, the number of the upper wiring layers is decreased, so that the distance from an aperture portion to a signal accumulation region can be shortened. Therefore, shading of obliquely incident light, color mixture, and so on can be suppressed.

Furthermore, the insulating film 11 used may be a high-dielectric (Hi-k) film, such as a hafnium oxide (HfO$_2$) film, formed by atomic layer deposition (ALD). In FIG. 3, the insulating film 11 is formed and extends between the semiconductor substrate 10 and the gate electrode 12 and between the sidewall 13 and the gate electrode 12, and covers the upper part of the insulating interlayer 14.

The transfer transistor illustrated in FIG. 3 further includes a photoelectric conversion region 20 and a readout region 30 respectively formed on the opposite sides of the above gate electrode 12.

The photoelectric conversion region 20 includes a signal accumulation region 21 and a surface shied layer 25. The signal accumulation region 21 is formed on the surface of the semiconductor substrate 10 and formed of, for example, an n-type second conductive-type semiconductor region. The surface shield layer 25 is formed above the semiconductor substrate 10 and formed of, for example, a p-type first conductive-type semiconductor region.

The signal accumulation region 21 formed of the second conductive-type semiconductor region extends from the surface of the semiconductor substrate 10 to the inside thereof. In addition, the signal accumulation region 21 is formed of two or more layers with different impurity concentrations. In other words, the uppermost portion of the signal accumulation region 21 is formed of a second conductive-type semiconductor region 22 containing an impurity substance, such as arsenic. In addition, the portion under the second conductive-type semiconductor region 22 is formed of a second conductive-type semiconductor region 23 which contains an impurity, such as arsenic, and the impurity concentration thereof is lower than that of the second conductive-type semiconductor region 22. Furthermore, the portion under the second conductive-type semiconductor region 23 is formed of a second conductive-type semiconductor region 24 which contains an impurity such as phosphorous.

As described above, the signal accumulation region 21 is formed from the surface 10S of the semiconductor substrate 10 to the inside thereof. In addition, the signal accumulation region 21 is formed so that the impurity concentration on the side of the surface 10S of the semiconductor substrate 10 is increased and the impurity concentration of the deep portion thereof is lowered. Thus, electrons can be accumulated near the surface of the semiconductor substrate 10. Therefore, a voltage applied to the gate electrode, which is used for the transfer of electrons from the signal accumulation region 21, can be reduced. Furthermore, in the above configuration, the impurity (i.e., arsenic) of the second conductive-type semiconductor region 22 is dispersed below the gate electrode 12. Therefore, the charges can be more easily transferred.

Note that, in the above-described photoelectric conversion region 20, the second conductive type (e.g., n-type) signal accumulation region 21 and the first conductive type (e.g., p-type) surface shield layer 25 are formed on the first conductive (e.g., p-type) semiconductor substrate 10. Alternatively, n-type and p-type may be reversed. In addition, the configuration of the signal accumulation region 21 is not limited to one described above. Alternatively, the signal accumulation region 21 may be formed using only arsenic or only phosphorous as an impurity. Furthermore, the signal accumulation region 21 is formed of a plurality of layers with different impurity concentrations. However, the number of the layers is not particularly limited thereto. The signal accumulation region 21 may be formed of one or two or more layers if required.

Furthermore, in the above configuration, the signal accumulation region 21 is formed such that arsenic, a substance with a small degree of diffusion in the thermal process, is used on the upper surface side of the semiconductor substrate and phosphorous, a substance with a large degree of diffusion in the thermal process, is used in the deep portion of the semiconductor substrate. Therefore, an impurity substance with a larger mass and a small degree of diffusion, such as arsenic, is used on the upper surface side of the semiconductor layer, so that the signal accumulation region 21 can be prevented from excessively diffusing from the signal accumulation region 21 to the readout region 30.

The surface shied layer 25 is formed above the signal accumulation region 21. The surface shield layer 25 includes a first conductive-type semiconductor region 26 and a first conductive-type semiconductor region 27. The first conductive-type semiconductor region 26 includes an impurity substance, such as boron, and the impurity concentration thereof is higher than that of the semiconductor substrate 10. The first conductive-type semiconductor region 27 also includes an impurity substance, such as boron, and the impurity concentration thereof is higher than that of the first conductive-type semiconductor region 26.

The surface shield layer 25 can be formed by, for example, injecting boron to a region formed by selective epitaxial growth on the semiconductor substrate. Therefore, the lower surface of the surface shield layer 25 is positioned slightly near the semiconductor substrate 10 by the diffusion of boron, compared with the interface between the semiconductor substrate 10 and the epitaxial growth layer. Therefore, any defect on the surface 10S of the semiconductor substrate 10 may not exist in the signal accumulation region 21 but in the surface shield layer 25.

Furthermore, the first conductive-type semiconductor region 26 among the regions of the surface shield layer 25 extends to the lower side of the sidewall 13 of the above-described gate electrode 12. Thus, the first conductive-type semiconductor region 26 covers the surface of the signal accumulation region 21 formed on the surface 10S of the semiconductor substrate 10. Therefore, dark current due to a defect existing on the surface 10S of the semiconductor substrate 10 can be prevented from being generated from the signal accumulation region 21. Therefore, a defected pixel with a white spot or the like can be suppressed.

In the readout region 30, a drain region 31 is formed on the semiconductor substrate 10. That is, the drain region 31 is formed of a second conductive-type semiconductor region and provided for reading out charges accumulated in the photoelectric conversion region. The drain region 31 includes a second conductive-type semiconductor region 32 and a second conductive-type semiconductor region 33. The second conductive-type semiconductor region 32 includes an impurity substance, such as, arsenic, and the impurity concentration thereof is higher than that of the second conductive-type semiconductor region 22. The second conductive-type semiconductor region 33 includes an impurity substance, such as phosphorus, and the impurity concentration thereof is higher than that of the second conductive-type semiconductor region 32.

The drain region 31 has an elevated source drain (ESD) structure in which, for example, arsenic or phosphorus is injected into a region by selective epitaxial growth on the semiconductor substrate 10.

In general, when an impurity region, such as a source or a drain region, is formed in the semiconductor substrate 10, any impurity substance may be introduced into the lower side of the gate electrode. Therefore, it has been desired to extend the length of the gate electrode. However, if the above-described ESD structure is employed, the drain region 31 is formed on the semiconductor substrate 10. Thus, except for the diffusion of slight impurity by heat, the second conductive-type semiconductor region is not formed in the semiconductor substrate 10. Therefore, the second conductive-type semiconductor region can be prevented from invading the lower side of the gate electrode due to thermal diffusion and a short channel effect can be reduced. As a result, the gate electrode length can be designed short. The area of the signal accumulation region can be enlarged as the gate electrode length is shortened. In addition, the size of the pixel can be minimized.

Next, an example of a method of manufacturing a solid-state imaging device in accordance with an embodiment of the present invention will be described.

Figure 4A:
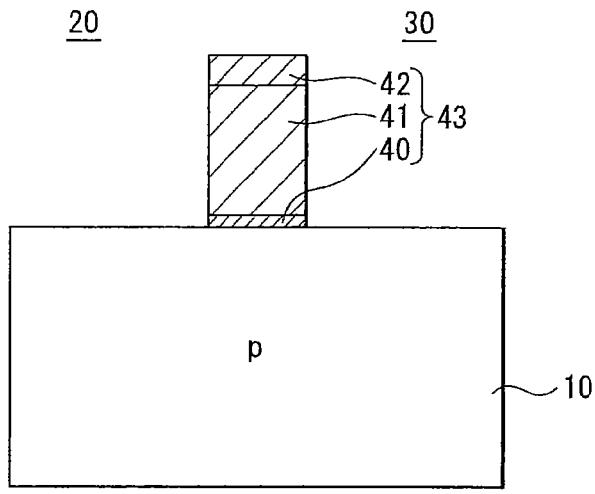
FIGS. 4A to 4C are cross sectional diagrams illustrating the process of manufacturing a solid-state imaging device according to an embodiment of the present invention, wherein FIGS. 4A to 4C correspond to the steps of the process, respectively.

First, a silicon dioxide film ($SiO_2$) 40, a polysilicon (poly-Si) layer 41, and a silicon nitride (SiN) layer 42 are stacked on a semiconductor substrate 10 in this order. Subsequently, a stacked body including the silicon dioxide film 40, the polysilicon layer 41, and the silicon nitride layer 42 is subjected to a patterning process to form a dummy electrode 43 as illustrated in FIG. 4A.

Figure 4B:
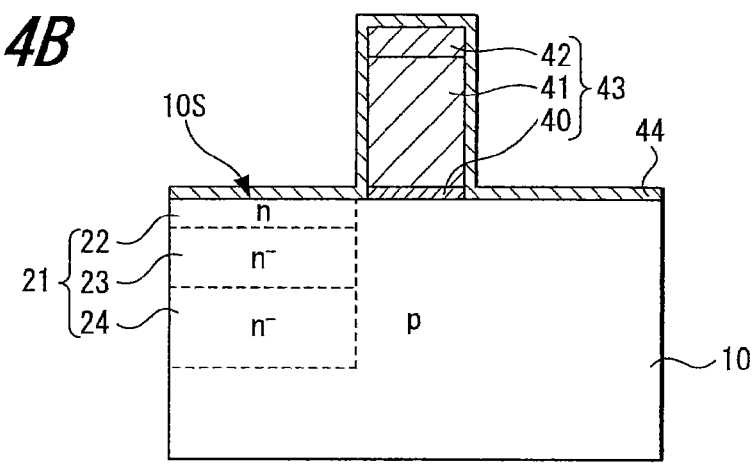

Subsequently, a silicon nitride (SiN) film 44 is formed on a dummy electrode 43 and a semiconductor substrate 10 by a low-pressure CVD method. Then, for example, arsenic is injected two times into a shallow region of the semiconductor substrate 10 on the photoelectric conversion region 20. In addition, for example, phosphorus is injected one time into a deep region of the semiconductor substrate 10. Therefore, as shown in FIG. 4B, a signal accumulation region 21 having a three-layered structure is formed. In the order from the upper surface side, the three-layered structure includes a second conductive-type semiconductor region 22 with arsenic, a second conductive-type semiconductor region 23 with arsenic at a concentration lower than that of the second conductive-type semiconductor region 22, and a second conductive-type semiconductor region 24 with phosphorus at a concentration lower than that of the second conductive-type semiconductor region 22.

In this way, the signal accumulation region 21 is formed from the surface 10S of the semiconductor substrate 10. In addition, the impurity concentration on the side of the surface 10S in the signal accumulation region 21 of the semiconductor substrate 10 is increased and the impurity concentration in the deep portion in the signal accumulation region 21 of the semiconductor substrate 10 is lowered. Accordingly, electrons can be accumulated near the surface of the semiconductor substrate 10.

In addition, the second conductive-type semiconductor region 22, the second conductive-type semiconductor region 23, and the second conductive-type semiconductor region 24 diffuse in the lateral direction, so that these regions can migrate toward the dummy electrode 43 over the position shown in FIG. 4B. Accordingly, electrons can be transferred readily from the signal accumulation region 21, and thus a voltage to be applied to the gate electrode for the transfer can be reduced. In addition, arsenic with a comparatively large mass and a small degree of diffusion in the thermal process may be used as an impurity for the second conductive-type semiconductor region 22 formed on the upper surface side of the semiconductor substrate 10. Thus, the signal accumulation region 21 can be prevented from diffusing more than needed.

Figure 4C:
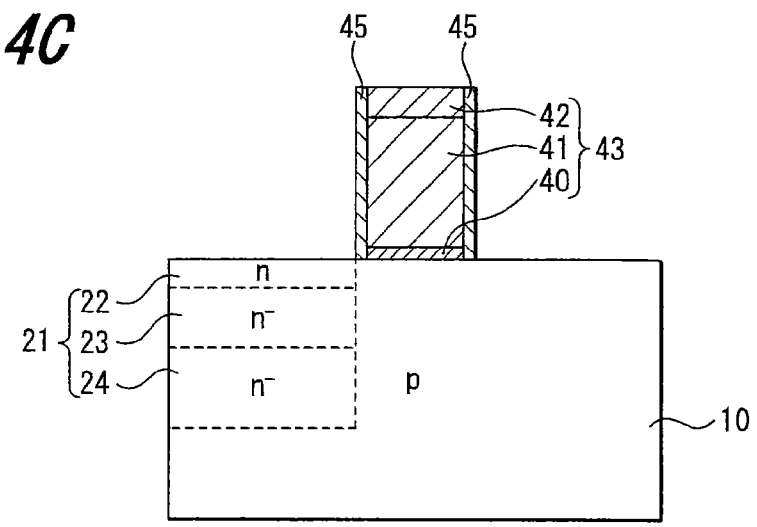

Subsequently, anisotropic etching, such as reactive ion etching (RIE), is carried out on the above silicon nitride film 44. Consequently, as shown in FIG. 4C, the silicon nitride film is removed from each of the semiconductor substrate 10 and the signal accumulation region 21. A thin silicon nitride film 45 is formed on the sidewall of the dummy electrode 43.

Figure 5A:
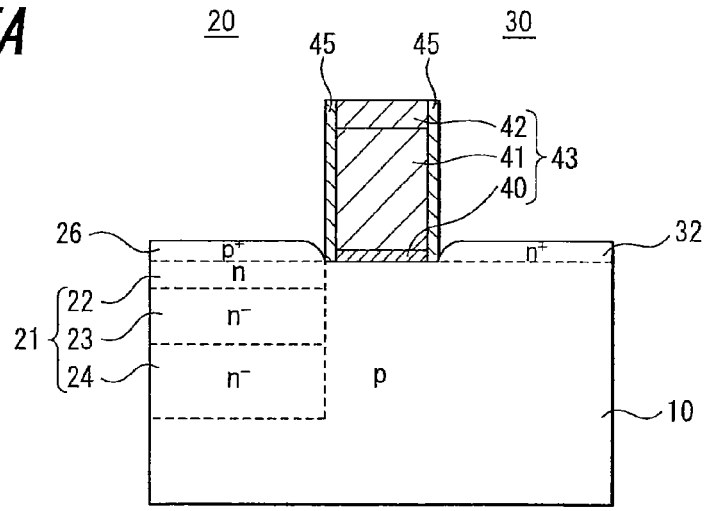
FIGS. 5A to 5C are cross sectional diagram illustrating the process of manufacturing a solid-state imaging device according to an embodiment of the present invention, wherein FIGS. 5A to 5C correspond to the steps of the process, respectively.

Next, as illustrated in FIG. 5A, after washing the surface of the semiconductor substrate 10 with dilute fluoric acid, a semiconductor layer made of silicon or the like is formed on both the photoelectric conversion region 20 and the readout region 30 using the selective epitaxial growth method.

At this time, the semiconductor layer on the side of the photoelectric conversion region 20 is selectively grown so that it can entirely cover the surface 10S of the above-described signal accumulation region 21. Furthermore, for example, boron at a concentration higher than that of the semiconductor substrate 10 is injected into the semiconductor layer formed on the side of the photoelectric conversion region 20 to form a first conductive-type semiconductor region 26. In addition, for example, arsenic at a concentration higher than that of the second conductive-type semiconductor region 22 is injected into the semiconductor layer formed on the side of the readout region 30 to form a second conductive-type semiconductor region 32.

In this way, the selective epitaxial growth is carried out on the semiconductor substrate 10 before the formation of the sidewall of the gate electrode 10, thereby forming the first conductive-type semiconductor region 26 and the second conductive-type semiconductor region 32. Since the sidewall of the gate electrode has not been formed, the semiconductor layer formed by the selective epitaxial growth can be formed from the both ends of the dummy electrode 43 and the silicon nitride film 45. Furthermore, the first conductive-type semiconductor region 26 can be formed immediately above the signal accumulation region 21 formed on the surface of the semiconductor substrate 10 from one end of the dummy electrode 43.

At this time, the first conductive-type semiconductor region 26 slightly enters to the side of the semiconductor substrate 10 beyond the interface between the semiconductor substrate 10 and the epitaxial growth layer. Therefore, defects existing on the interface of the semiconductor substrate 10 is not present in the signal accumulation region 21 but in the first conductive-type semiconductor region 26. Therefore, dark current generated from a defect on the interface of the signal accumulation region 21 can be prevented by the first conductive-type semiconductor region 26 and the generation of a defect pixel, such as a white spot, can be suppressed.

Figure 5B:
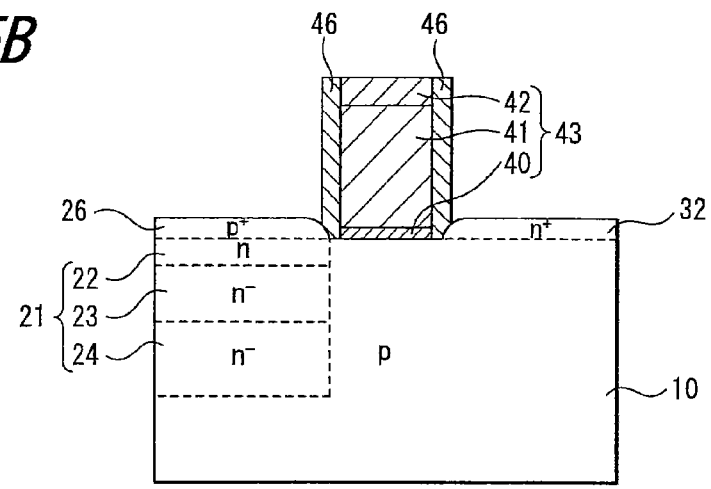

Subsequently, the silicon nitride film 45 is removed from the side face of the dummy electrode 43 by wet etching. Then, a $SiO_2$ film is formed on the whole surface and then anisotropically etched by RIE, or the like. Accordingly, as shown in FIG. 5B, a sidewall 46 is formed on the side face of the dummy electrode 43 by a silicon oxide ($SiO_2$) film.

Figure 5C:
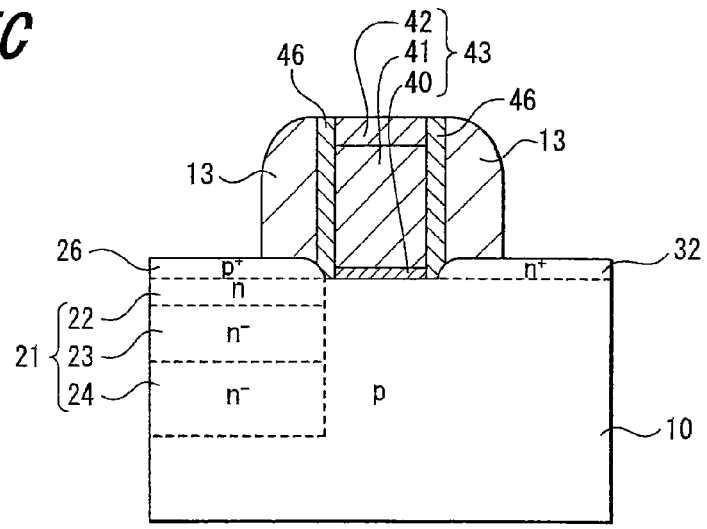

Subsequently, after the formation of the SiN film on the whole surface, anisotropic etching such as RIE or the like is carried out. Consequently, as illustrated in FIG. 5C, a sidewall 13 formed of a SiN film is formed on the side face of the sidewall 46 formed of a $SiO_2$ film. The sidewall 13 made of the SiN film is thicker than the sidewall 46 formed of a $SiO_2$ film. Furthermore, in the photoelectric conversion region 20 and the readout region 30, the sidewall 13 formed of the SiN film is formed above the first conductive-type semiconductor region 26 and the second conductive-type semiconductor region 32. Thus, both the first conductive-type semiconductor region 26 and the second conductive-type semiconductor region 32 are formed below the sidewall of the gate electrode.

Next, a semiconductor layer made of silicon or the like is formed again on the photoelectric conversion region 20 and the readout region 30 by the selective epitaxial growth method. Then, a first conductive-type semiconductor region 27 is formed on the semiconductor layer formed on the side of the photoelectric conversion region 20 by, for example, injecting boron or the like at a concentration higher than that of the first conductive-type semiconductor region 26. In addition, a second-conductive semiconductor region 33 is formed on the semiconductor layer formed on the side of the readout region 30 by, for example, injecting phosphorus or the like at a concentration higher than that of the second conductive-type semiconductor region 32.

Figure 6A:
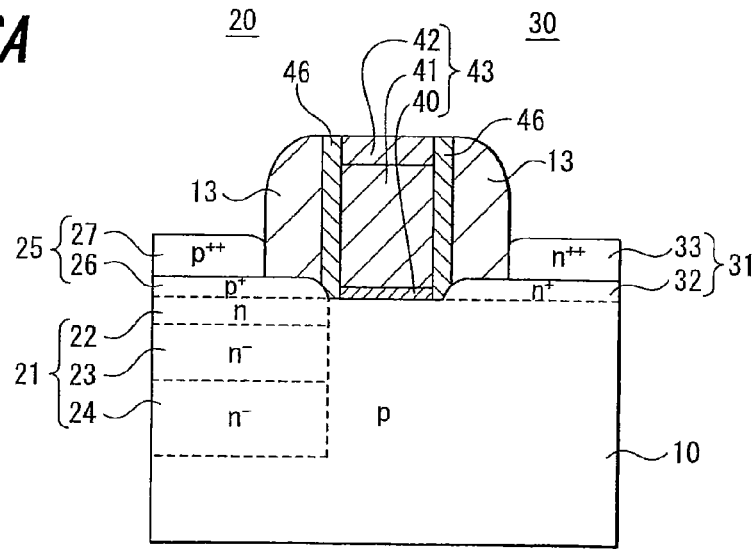
FIGS. 6A to 6C are cross sectional diagrams illustrating the process of manufacturing a solid-state imaging device according to an embodiment of the present invention, wherein FIGS. 6A to 6C correspond to the steps of the process, respectively.

Therefore, as illustrated in FIG. 6A, in the photoelectric conversion region 20, a surface shield layer 25 including the first conductive-type semiconductor regions 26 and 27 with different impurity concentrations is formed. Further, a drain region 31 is formed on the side of the readout region 30. The drain region 31 includes the second conductive-type semiconductor regions 32 and 33 with different impurity concentrations for reading out charges accumulated in the signal accumulation region 21.

Figure 6B:
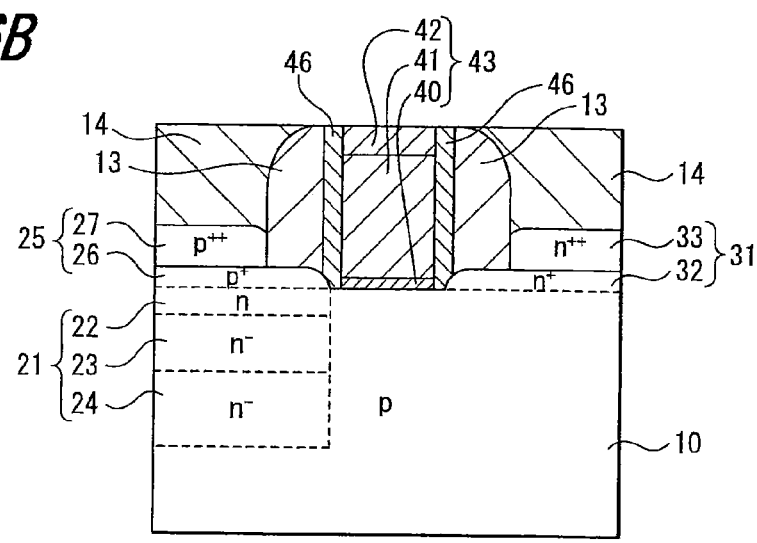

Next, as shown in FIG. 6B, for example, a high density plasma (HDP) oxide film made of $SiO_2$ or the like is formed on the whole surface as an insulating interlayer 14. Subsequently, the HDP oxide film, the insulating interlayer 14, is planarized by chemical mechanical polishing (CMP) or the like so as to be leveled with the dummy electrode 43.

Figure 6C:
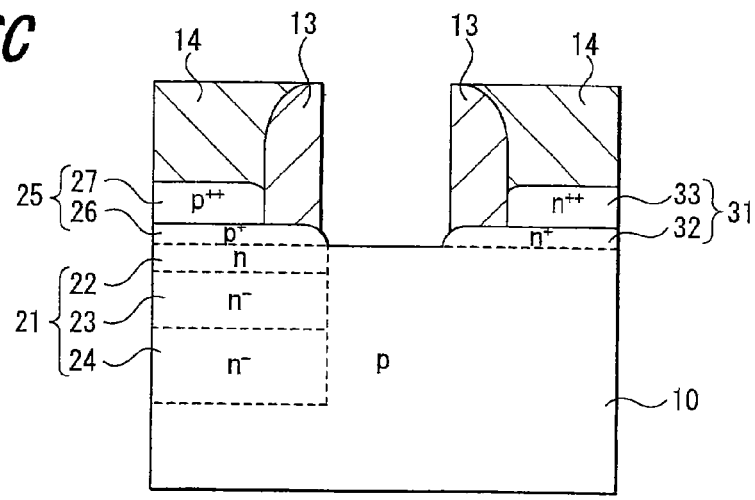

Next, as illustrated in FIG. 6C, the silicon dioxide film 40, the polysilicon layer 41, and the silicon nitride layer 42, which form the dummy electrode 43, are removed by continuous etching. Consequently, the dummy electrode 43 can be removed.

Figure 7A:
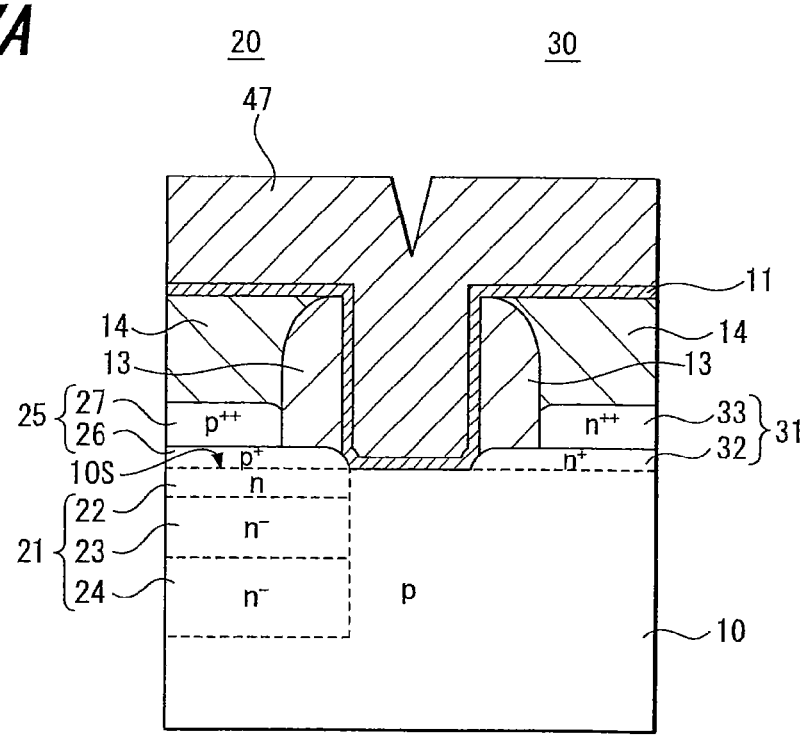
FIGS. 7A and 7B are cross sectional diagrams illustrating the process of manufacturing a solid-state imaging device according to an embodiment of the present invention, wherein FIGS. 7A and 7B correspond to the steps of the process, respectively.

Next, as illustrated in FIG. 7A, an insulating film 11 is formed on the whole surface. The insulating film 11 is formed of a high-dielectric (Hi-k) film, such as a hafnium oxide ($HfO_2$) film, formed by atomic layer deposition (ALD) or the like. Then, an electric conductor 47 is embedded in an electrode portion after etching the dummy electrode 43.

Figure 7B:
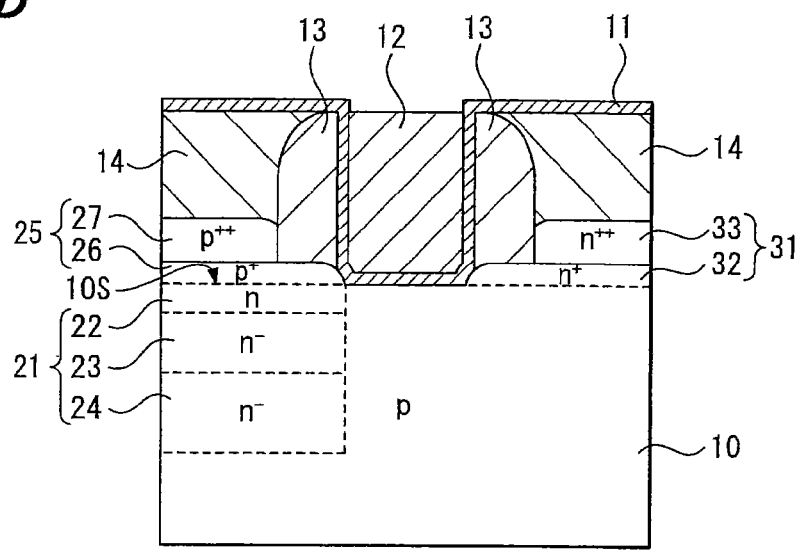

Subsequently, the electric conductor 47 is etched using CMP and leveled with the insulating film 11 to planarize the electric conductor 47, thereby forming a gate electrode 12. Consequently, the transfer transistor as illustrated in FIG. 7B can be produced.

It should be noted that a method of forming the first conductive-type semiconductor regions 26 and 27 and the second conductive-type semiconductor regions 32 and 33 as shown in FIG. 5A may be carried out as follows instead of the above method. For example, the first conductive-type semiconductor region 26 (or 27) and the second conductive-type semiconductor region 32 (or 33) are respectively subjected to selective epitaxial growth in which the first conductive type or second conductive type impurity substance is added in advance.

In this case, there may be no need of ion injection to each of the first conductive-type semiconductor region 26 (or 27) and the second conductive-type semiconductor region 32 (or 33). Furthermore, the selective epitaxial growth, which is used in the formation of the first conductive-type semiconductor regions 26 and 27 and the second conductive-type semiconductor regions 32 and 33, can be carried out in common with the selective epitaxial growth of other transistors such as PMOS transistors and MNOS transistors (not shown) of the solid-state imaging device.

Furthermore, in the above-described transfer transistor, the gate electrode 12 formed of the metal gate may be alternatively formed of a polysilicon. In this case, the process proceeds to the step shown in FIG. 6C. Then, the dummy gate electrode made of polysilicon is used as a gate electrode 12 to produce a transfer transistor.

Furthermore, the ion injection of impurity substances as illustrated in FIGS. 5A and 6A as described above can be carried out in common with the process of the ion injection of other PMOS transistors and NMOS transistors (not shown in the figure) of the solid-state imaging device. For example, the ion injection for forming the first conductive-type semiconductor region, which is the surface shield layer of the photoelectric conversion region, may be carried out in common with the ion injection for forming the first conductive-type semiconductor region of PMOS transistor. Furthermore, the ion injection for forming the second conductive-type drain region of the readout region may be carried out in common with the ion injection for forming the second conductive-type drain region of NMOS transistor.

Furthermore, the ion injection process for forming the signal accumulation region 21 as illustrated in FIG. 4B may be carried out after the selective epitaxial growth illustrated in FIG. 5A. For example, a semiconductor layer is formed by the selective epitaxial growth and the ion injection is then carried out in common with the ion injection for forming the second conductive-type semiconductor region 32.

It should be noted that, in addition to the above-described processes, a heat treatment process, a surface treatment process, or the like maybe suitably added. As described above, the solid-state imaging device of the present embodiment can be produced.

Figure 8:
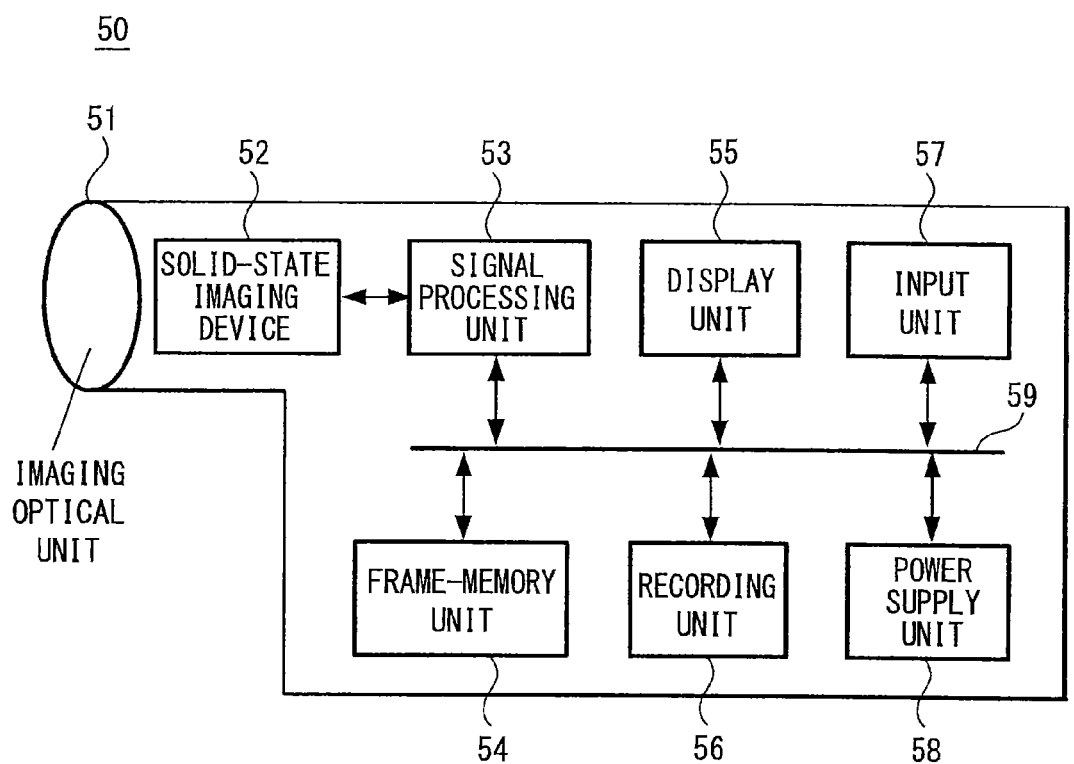
FIG. 8 is a block diagram illustrating an imaging apparatus according to an embodiment of the present invention.

FIG. 8 shows a block diagram of an imaging apparatus to which the solid-state imaging device formed using the above-described transfer transistor is applied. The imaging apparatus will be described with reference to FIG. 8.

An imaging apparatus 50 as illustrated in FIG. 8 is designed as a mobile phone unit, a digital still camera, a video camera, or any of other electronic devices having imaging functions. The imaging apparatus 50 includes an imaging optical unit 51, a solid-state imaging device 52, a signal processing unit 53, and a frame memory unit 54, a display unit 55, a memory unit 56, an input unit 57, and a power supply unit 58 which are connected to the signal processing unit 53 via a transmission line 59.

The imaging optical unit 51 includes various lenses, a shutter, an aperture mechanism, and so on and guides subject image light to a solid-state imaging device 52. The solid-state imaging device 52 is the above-described solid-state imaging device according to the embodiment and photoelectrically converts subject light passing through the imaging optical unit 51 to be output as a signal. The signal processing unit 53 includes a digital signal processor (DSP) and so on for processing digital signals and performs the processing, such as formatting, on image signals output from the solid-state imaging device 52, thereby converting the signals into display data and recording data.

The frame-memory unit 54 includes a random access memory (RAM) and so on and temporarily stores image data processed by the signal processing unit 53. The display unit 55 includes a liquid crystal display and so on and displays image data processed by the signal processing unit 53. The recording unit 56 includes a flush memory, an erasable programmable ROM (EPROM), a hard disk (HD), and so on and stores image data. The input unit 57 includes a shutter button, various function keys, cursor keys, and so on, which enter control signals for controlling the actions of the imaging apparatus from the outside. The power supply unit 58 supplies operation power to each unit of the imaging apparatus 50.

The generation of dark current can be prevented by providing the imaging apparatus 50 with the solid-state imaging device of the above embodiment. Thus, white points or the like can be suppressed on pixels, so that an imaging apparatus with few defective pixels can be obtained.

It should be noted that the configuration of the imaging apparatus 50 is not limited to the above-described one, and various configurations may be employed as an alternative.

The present invention is not limited to the above configurations but can be any of various configurations without departing from the gist of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid-state imaging device, the method comprising the steps of:
    forming lower first and second conductive-type semiconductor regions on a surface of a substrate, the conductivity of said substrate being opposite to the conductivity of said lower second conductive-type semiconductor region;
    forming a gate electrode between said lower first and second conductive-type semiconductor regions, the conductivity of said lower first conductive-type semiconductor region being opposite to the conductivity of said lower second conductive-type semiconductor region,
    wherein said lower first and second conductive-type semiconductor regions and said substrate are insulated from said gate electrode,
    wherein said lower first conductive-type semiconductor region is deposited onto a second conductive-type layer in the substrate, the conductivity of said second conductive-type layer being opposite to the conductivity of said substrate,
    wherein said second conductive-type layer is between said lower first conductive-type semiconductor region and a low concentration layer, an impurity concentration of the low concentration layer being lower than an impurity concentration of the second conductive-type layer,
    wherein an upper first conductive-type semiconductor region is selective epitaxially grown on said lower first conductive-type semiconductor region, an upper second conductive-type semiconductor region being selective epitaxially grown on said lower second conductive-type semiconductor region, and wherein an impurity concentration of the upper second conductive-type semiconductor region is higher than an impurity concentration of the lower second conductive-type semiconductor region,
    wherein said lower first conductive-type semiconductor region is in a readout region and lower second conductive-type region is in a photoelectric conversion region of the solid-state imaging device.

2. The method of manufacturing a solid-state imaging device according to claim 1, wherein said gate electrode is formed after the step of forming the lower first and second conductive-type semiconductor regions.

3. The method of manufacturing a solid-state imaging device according to claim 1, wherein said lower first and second conductive-type semiconductor regions are selective epitaxially grown.

4. The method of manufacturing a solid-state imaging device according to claim 1, wherein the conductivity of said lower first conductive-type semiconductor region is P-type, the conductivity of said lower second conductive-type semiconductor region being N-type.

5. The method of manufacturing a solid-state imaging device according to claim 1, wherein a sidewall is on said lower first conductive-type semiconductor region, another sidewall being on said lower second conductive-type semiconductor region.

6. The method of manufacturing a solid-state imaging device according to claim 1, wherein the conductivity of said low concentration layer is the same as the conductivity of said second conductive-type layer.

7. The method of manufacturing a solid-state imaging device according to claim 1, wherein an upper first conductive-type semiconductor region is on said lower first conductive-type semiconductor region, an upper second conductive-type semiconductor region being on said lower second conductive-type semiconductor region, and wherein said gate electrode is insulated from said upper first and second conductive-type semiconductor regions.

8. The method of manufacturing a solid-state imaging device according to claim 1, wherein an upper first conductive-type semiconductor region is on said lower first conductive-type semiconductor region, an upper second conductive-type semiconductor region being on said lower second conductive-type semiconductor region, and wherein an impurity concentration of the upper first conductive-type semiconductor region is higher than an impurity concentration of the lower first conductive-type semiconductor region.

9. The method of manufacturing a solid-state imaging device according to claim 1, wherein an upper first conductive-type semiconductor region is on said lower first conductive-type semiconductor region, an upper second conductive-type semiconductor region being on said lower second conductive-type semiconductor region, and wherein the conductivity of said upper first conductive-type semiconductor region is opposite to the conductivity of said upper second conductive-type semiconductor region.

10. The method of manufacturing a solid-state imaging device according to claim 1, wherein said lower first conductive-type semiconductor region is in a readout region of a transistor, said lower first conductive-type semiconductor region being in a photoelectric conversion region of the transistor.

* * * * *